United States Patent
Filipovic

(10) Patent No.: US 6,868,263 B2
(45) Date of Patent: Mar. 15, 2005

(54) DIGITAL AUTOMATIC GAIN CONTROL

(75) Inventor: Daniel F. Filipovic, Solana Beach, CA (US)

(73) Assignee: Qualcomm Incorporated, San Diego, CA (US)

( * ) Notice: Subject to any disclaimer, the term of this patent is extended or adjusted under 35 U.S.C. 154(b) by 480 days.

(21) Appl. No.: 10/167,713

(22) Filed: Jun. 10, 2002

(65) Prior Publication Data

US 2003/0227986 A1 Dec. 11, 2003

(51) Int. Cl.[7] .................................................. H04B 1/06
(52) U.S. Cl. .................................................. 455/245.1
(58) Field of Search ........................... 455/108, 127.1, 455/118, 245.1, 340.1, 234.1, 234.2, 232.1, 69, 239.1, 241.1, 242.1, 244.1, 249.2, 247.1, 280.1; 375/345, 354, 279–280, 326, 329, 331; 330/129–130, 284, 279–280

(56) References Cited

U.S. PATENT DOCUMENTS

| | | | |
|---|---|---|---|
| 5,623,521 A | | 4/1997 | Yaguchi et al. ............. 375/345 |
| 5,812,025 A | * | 9/1998 | Shimazaki .................. 330/129 |
| 5,940,451 A | * | 8/1999 | Kim ........................... 375/345 |
| 6,088,583 A | * | 7/2000 | Shimizu et al. ........... 455/235.1 |
| 6,160,443 A | | 12/2000 | Maalej et al. ............... 329/304 |
| 6,249,554 B1 | | 6/2001 | Mobin et al. ............... 375/345 |
| 6,311,047 B1 | * | 10/2001 | Gotou ....................... 455/234.1 |
| 6,473,016 B2 | * | 10/2002 | Piirainen et al. ............. 341/139 |
| 2003/0186665 A1 | * | 10/2003 | Black et al. .............. 455/240.1 |
| 2004/0092236 A1 | * | 5/2004 | Irie et al. ..................... 455/118 |
| 2004/0198257 A1 | * | 10/2004 | Takano et al. .............. 455/108 |

* cited by examiner

Primary Examiner—Pablo N. Tran
(74) Attorney, Agent, or Firm—Philip Wadsworth; Charles D. Brown; Howard H. Seo

(57) ABSTRACT

A wireless communication device (WCD) implements an improved architecture for performing automatic gain control (AGC). For example, a WCD including a wireless receiver and a modem may incorporate a digital variable gain amplifier (DVGA) and an automatic gain control (AGC) unit that have the improved architecture. In particular, the architecture of the DVGA and AGC unit may be simplified and improved specifically for handing signals modulated according to a wireless networking standard such as one of the IEEE 802.11 standards.

22 Claims, 7 Drawing Sheets

DIGITAL AUTOMATIC GAIN CONTROL

FIELD

This disclosure relates to wireless communication and, more particularly, to wireless local area network (WLAN) systems.

BACKGROUND

Wireless networks allow computing devices to share information and resources via wireless communications. Examples of computing devices used in wireless networks include laptop or desktop computers, personal digital assistants (PDAs), mobile phones such as cellular radiotelephones and satellite radiotelephones, data terminals, data collection devices, personal digital assistants (PDAs) and other portable and non-portable computing devices. One broad family of standards developed to facilitate wireless networking is set forth in the IEEE 802.11 standard. The original IEEE 802.11 standard provides data transfer rates of 1–2 Megabits per second (Mbps) in a 2.4–2.483 Gigahertz (GHz) frequency band (hereafter the 2.4 GHz band). However, a number of extensions to the original IEEE 802.11 standard have been developed in an effort to increase data transfer rates.

The IEEE 802.11b standard (sometimes referred to as 802.11 wireless fidelity or 802.11 Wi-Fi) is an extension of the IEEE 802.11 standard that provides 11 Mbps transmission (with a fallback to 5.5, 2.0 and 1.0 Mbps) in the 2.4 GHz band. The IEEE 802.11b standard utilizes binary phase shift keying (BPSK) for 1.0 Mbps transmission and quadrature phase shift keying (QPSK) for 2.0, 5.5 and 11.0 Mbps transmission. Complementary code keying (CCK) techniques are also employed by IEEE 802.11b in order to achieve multi-channel operation in the 2.4 GHz band for the 5.0 and 11.0 Mbps transmission rates.

The IEEE 802.11g standard is another extension of the IEEE 802.11 standard. The IEEE 802.11g standard utilizes orthogonal frequency division multiplexing (OFDM) in the 2.4 GHz frequency band to provide data transmission at rates up to 54 Mbps. The IEEE 802.11g standard also provides backwards capability with 802.11b networks. The IEEE 802.11a standard is an extension of IEEE 802.11 standard that utilizes OFDM in a 5 GHz frequency band to provide data transmission at rates up to 54 Mbps. These and other wireless networks have been developed. Additional extensions to the IEEE 802.11 standard, as well as other WLAN standards will likely emerge in the future.

Wireless networks may contain one or more access points that interface with wireless and/or wired networks. Access points may also interface wirelessly with other access points to extend the geographical size of the wireless network. In addition, wireless routers may be used in wireless networks to perform data routing functions within the wireless setting. Sometimes, both wireless routers and access points are used together to form a relatively large wireless network environment.

Wireless communication devices that support wireless networking standards may also support other communication standards, such as standards commonly used for voice communications. The voice communication standards may be based on one or more of a variety of modulation techniques, such as frequency division multiple access (FDMA), time division multiple access (TDMA), and various spread spectrum techniques. One common spread spectrum technique used in wireless voice communication is code division multiple access (CDMA) signal modulation. In CDMA, multiple communications are simultaneously transmitted over a spread spectrum radio frequency (RF) signal. Other wireless communication systems may use different modulation techniques. For example, GSM systems use a combination of TDMA and FDMA modulation techniques. These techniques are also used in other systems related to GSM systems, including the DCS1800 and PCS1900 systems, which operate at 1.8 GHz and 1.9 GHz, respectively.

A WCD that receives a CDMA signal, an IEEE 802.11 signal, or other modulated information signal, typically includes a variable gain amplifier (VGA) having a gain that is adjustable via a control signal. The process of adjusting the gain of a VGA using a control signal is known as automatic gain control (AGC). To facilitate demodulation of a received signal with an improved signal-to-noise ratio, AGC can be used to hold the average power of the baseband signal close to a desired set point. Some variable gain amplifiers function in the digital realm. In that case, the digital variable gain amplifier (DVGA) scales digital samples that correspond to a baseband signal.

SUMMARY

In one embodiment, a wireless communication device incorporates a digital variable gain amplifier (DVGA) that has an improved architecture. The DVGA may include a multiplier to multiply an M-bit baseband sample by an N-bit gain factor to generate a product having M+N bits. The DVGA may also include a shift register to shift the M-bit baseband sample by N bits to generate a shifted value having M+N bits. The DVGA may also include a bit selector that generates an output by selecting at least a subset of M+N+1 bits of a sum of the product and the shifted value. The output of the DVGA can be provided to a demodulation unit for demodulation. By avoiding truncation of the M+N bit product to match the bit size of the baseband sample, and instead shifting the baseband sample by N bits to match the M+N bit size of the product, performance of the DVGA can be enhanced. In particular, the input amplitude for small signals may converge to a desired level more smoothly compared to DVGAs in which the bits of the product of the input signal and the gain factor are rounded or truncated.

In another embodiment, a wireless communication device includes an automatic gain control unit that measures a power level of baseband samples and accumulates differences between the measured power levels and a set point. The wireless communication device may also include a DVGA that adjusts a gain factor as a function of the accumulation and applies the adjusted gain factor to scale the baseband samples. Because measured power level differences are accumulated, and used to adjust the gain factor, the architecture can avoid conversions of the power level differences prior to accumulation. In this manner, the architecture can be simplified.

Various embodiments may be implemented in software, hardware, firmware, or any combination thereof. Additional details of various embodiments are set forth in the accompanying drawings and the description below. Other features, objects and advantages will become apparent from the description and drawings, and from the claims.

DETAILED DESCRIPTION

In general, this disclosure describes a wireless communication device (WCD) configured to perform various signal processing tasks associated with wireless communication. More specifically, a wireless communication device (WCD) including a wireless receiver and a modem may incorporate a digital variable gain amplifier (DVGA) and an automatic gain control (AGC) unit that have an improved architecture. In particular, the architecture of the DVGA and AGC unit may be simplified and improved specifically for handing signals modulated according to a wireless networking standard such as one of the IEEE 802.11 standards The WCD uses automatic gain control (AGC) to maintain the magnitude of baseband samples at or close to a desired level to facilitate demodulation of received signals with an improved signal-to-noise ratio. According to various embodiments, all of the bits of the product of an input baseband sample and a gain factor can be used rather than rounding or truncating the product prior to extracting an output signal. Because all of the bits of the product may be used in extracting the output signal, AGC performance may be improved. In particular, the input amplitude for small signals may converge to a desired level more smoothly compared to DVGAs in which the bits of the product of the input signal and the gain factor are rounded or truncated.

In addition, the AGC unit may accumulate differences between power estimates of baseband samples and a set point without performing translations on the differences. The accumulated differences can be used to adjust the gain factor of the DVGA. In this manner, the architecture can be simplified, avoiding the need to access lookup tables after estimating power and before accumulating the power estimates.

Figure 1:
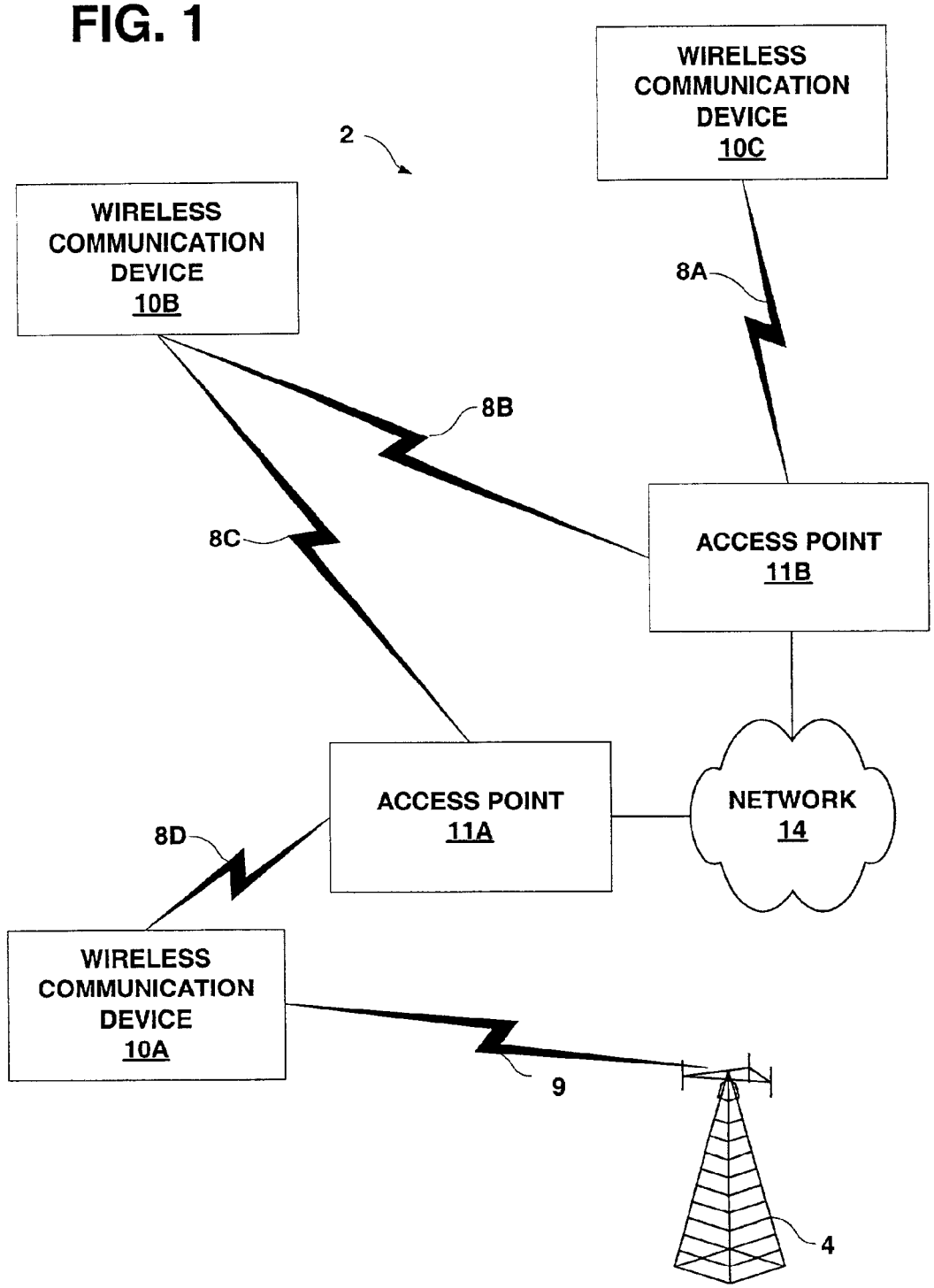
FIG. 1 is a block diagram illustrating a wireless communication system in which wireless communication devices (WCDs) can implement one or more of the techniques described herein.

FIG. 1 is a block diagram illustrating a wireless communication system 2 including a number of wireless communication devices 10A–10C, collectively referred to as wireless communication devices 10. Wireless communication devices (WCDs) 10 may be any portable computing device configured to support wireless networking. Each device may be, for example, a desktop or portable computer operating in a Windows™, Macintosh™, Unix, or Linux environment, a personal digital assistant (PDA) based on the Palm™, Windows CE, or similar operating system environments for small portable devices, or other wireless device such as a mobile radiotelephone, an interactive television, a wireless data terminal, a wireless data collection device, an Internet kiosk, a network-ready appliance for the home environment, a wireless server, and the like.

WCDs 10 communicate with one another in wireless communication system 2 via wireless signals 8A–8D (hereafter wireless signals 8). In particular, WCDs 10 may communicate according to a wireless protocol such as the protocol defined by a wireless networking standard, e.g., one of the standards in the IEEE 802.11 family of standards. Wireless signals 8 may be sent to and from the respective WCDs 10 by wireless access points 11A and 11B. The access points 11 may have wired connections to a network 14, such as a local area network, a wide area network, or a global network such as the Internet.

Alternatively or additionally, one or more WCDs 10 within system 2 may be configured to support one or more voice communication standards. For example, one or more base stations 4 may communicate voice data 9 to WCD 10A via voice communication techniques such as CDMA techniques, FDMA techniques, TDMA techniques, various combined techniques, and the like. For example, a WCD 10 may be designed to support one or more CDMA standards such as (1) the "TIA/EIA-95-B Mobile Station-Base Station Compatibility Standard for Dual-Mode Wideband Spread Spectrum Cellular System" (the IS-95 standard), (2) the "TIA/EIA-98-C Recommended Minimum Standard for Dual-Mode Wideband Spread Spectrum Cellular Mobile Station" (the IS-98 standard), (3) the standard offered by a consortium named "3rd Generation Partnership Project" (3GPP) and embodied in a set of documents including Document Nos. 3G TS 25.211, 3G TS 25.212, 3G TS 25.213, and 3G TS 25.214 (the W-CDMA standard), (4) the standard offered by a consortium named "3rd Generation Partnership Project 2" (3GPP2) and embodied in a set of documents including "TR-45.5 Physical Layer Standard for cdma2000 Spread Spectrum Systems," the "C.S0005-A Upper Layer (Layer 3) Signaling Standard for cdma2000 Spread Spectrum Systems," and the "C.S0024 CDMA2000 High Rate Packet Data Air Interface Specification" (the CDMA2000 standard), (5) the HDR system documented in TIA/EIA-IS-856, "CDMA2000 High Rate Packet Data Air Interface Specification, and (6) some other standards. In addition, WCDs 10 may be designed to support other standards, such as the GSM standard or related standards, e.g., the DCS1800 and PCS1900 standards. GSM systems employ a combination of FDMA and TDMA modulation techniques. WCDs 10 may also support other FDMA and TDMA standards.

To facilitate demodulation of a received 802.11b signal with an improved signal-to-noise ratio, and possibly a reduced number of bits, a WCD 10 includes a digital variable gain amplifier (DVGA) having a gain that is adjustable via an automatic gain control (AGC) unit. For example, the AGC unit may be used to maintain the average power of baseband samples close to a desired value. More particularly, the AGC unit of WCD 10 measures the power level of baseband samples output by the DVGA. The measured power levels can be compared with a reference value, i.e., a set point, that represents the desired signal power. Error signals, i.e., differences between the measured power and the set point, can be generated as a result of these comparisons and accumulated. The accumulation of differences between the set point and the measured power levels can then be used to adjust the gain of the DVGA so that the power level of baseband samples output by the DVGA approach the set point.

In order to facilitate convergence of small signals to the set point, the DVGA in WCD 10 implements a technique in which all of the bits of the product of an input signal and a gain factor are available for extracting an output signal. Because all of the bits of the product may be used in extracting the output signal, the input amplitude for a small signal converges to a desired level more smoothly than if the bits of the product of the input signal and the gain factor were rounded or truncated.

Also, because the AGC unit of WCD 10 accumulates error signals having units of power, translations or conversions of the measured error signals can be avoided. Thus, the accumulated power estimates can be used to adjust the gain factor of the DVGA. In this manner, the architecture can be simplified, avoiding the need to access lookup tables after estimating power and before accumulating the power estimates.

Figure 2:
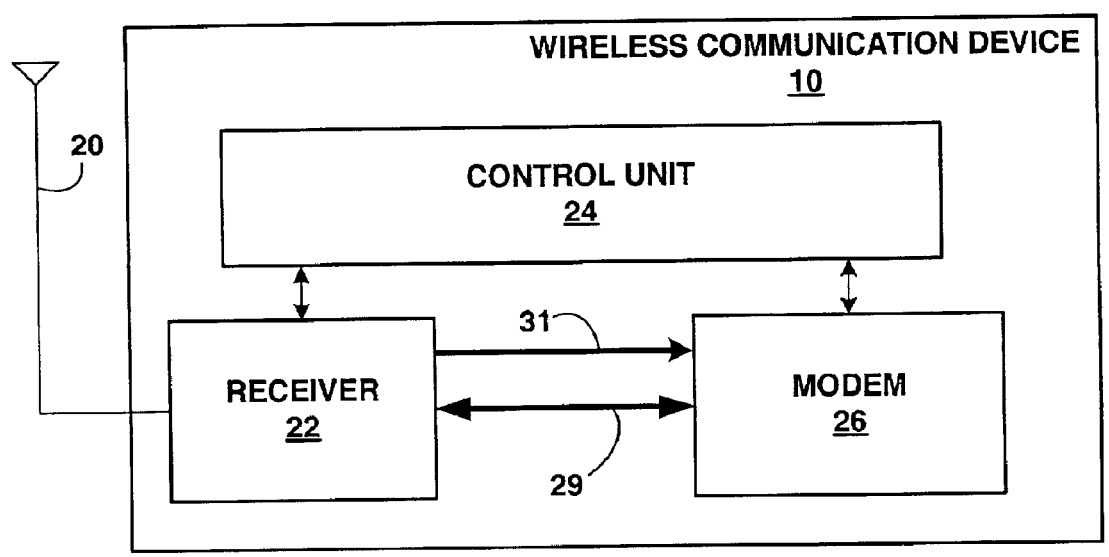
FIG. 2 is a block diagram of a WCD depicted in FIG. 1.

FIG. 2 is a block diagram of an exemplary WCD 10. As shown, WCD 10 includes an antenna 20 coupled to a receiver 22, a modem (modulator/demodulator) 26 coupled to the receiver 22 via serial bus 29 and analog transmission line 31, and a control unit 24 coupled to both the receiver 22 and the modem 26. Control unit 24 may form part of modem 26, but is illustrated separately for simplicity. In some cases, antenna 20 may be coupled to a duplexer (not shown), which is in turn coupled to both receiver 22 and a transmitter (not shown) that generates the wireless signals to be transmitted from the WCD 10. For simplicity, however, the duplexer and transmitter are not illustrated.

Receiver 22 may condition a received analog signal and downconvert the received RF signal to a baseband frequency, whereas modem 26 converts the analog baseband signal to digital samples, processes the digital samples, and performs demodulation to extract the encoded data. In this disclosure, the term modem refers to a component or collection of components that can perform modulation, demodulation, or both modulation and demodulation.

Receiver 22 receives wireless RF signals, such as signals modulated according to a modulation scheme used for wireless networking, such as the BPSK or QPSK modulation schemes typically implemented by devices compliant with the IEEE 802.11b wireless networking standard or the OFDM modulation scheme typically implemented by devices compliant with the IEEE 802.11g or IEEE 802.11a wireless networking standards. The received information may take the form of data packets encoded according to the modulation scheme used. Dividing the data into packets has several advantages including enabling the sending device to resend only those individual packets that may be lost or corrupted during transmission.

Wireless networks typically operate according to a resend-until-acknowledged protocol in which the packets are resent to WCD 10 until WCD 10 acknowledges receipt of the packet. Accordingly, packets may be transmitted to WCD 10 a number of times before WCD 10 receives, processes and acknowledges reception of the packet. Packets may be received at any time, and are usually temporally separated from other packets.

Receiver 22 receives RF waveforms via antenna 20 according to the modulation scheme used. Receiver 22 conditions the received waveform, such as by filtering or scaling the RF waveform and mixing the waveform down to baseband. Receiver 22 may implement a zero intermediate frequency (zero IF) architecture in which the waveform is mixed directly into a baseband signal without first being mixed to an intermediate frequency (IF) signal. The techniques described below, however, are not necessarily limited to Zero IF implementations, but may also be used in implementations having one or more IF sections.

Prior to mixing the signal down to baseband (sometime referred to as the down conversion process), receiver 22 may scale the RF waveform according to a selected one of a plurality of gain states. Modem 26 may determine if the gain state is too large and may send one or more signals to receiver 22 to reduce or adjust the gain state, if necessary.

Once the gain state is properly defined, modem 26 may perform residual gain adjustments on baseband samples using a digital voltage gain amplifier (DVGA). The gain of the DVGA is determined by an automatic gain control (AGC) unit.

For IEEE 802.11b wireless networks, receiver 22 generates baseband signals for I- and Q-components of the RF signal as is well known in the art. The I-component refers to the in-phase component of the complex waveform, whereas the Q-component refers to the quadrature-phase component of the complex waveform. In both cases, receiver 22 passes the baseband signal for the respective I- or Q-components of the complex waveform to modem 26 for demodulation. For example, I- and Q-baseband signals can be sent from receiver 22 to modem 26 via analog transmission line 31. Within modem 26, the I- and Q-components are sampled by an analog-to-digital converter. At that point, each of the I- and Q-baseband signals may take the form of a stream of 10-bit samples. Control unit 24 may send commands to receiver 22 and modem 26 to control the processing of the received packet. In some implementations, control unit 24 forms part of modem 26.

Modem 26 may incorporate a DVGA that implements a technique in which all of the bits of the product of an input signal and a gain factor are available for extracting an output signal. Modem 26 may also incorporate an AGC unit that accumulates error signals having units of power. Such techniques can improve the architecture of the DVGA and AGC unit, providing acceptable performance in processing baseband samples modulated according to a wireless networking standard such as one of the IEEE 802.11 standards.

Figure 3:
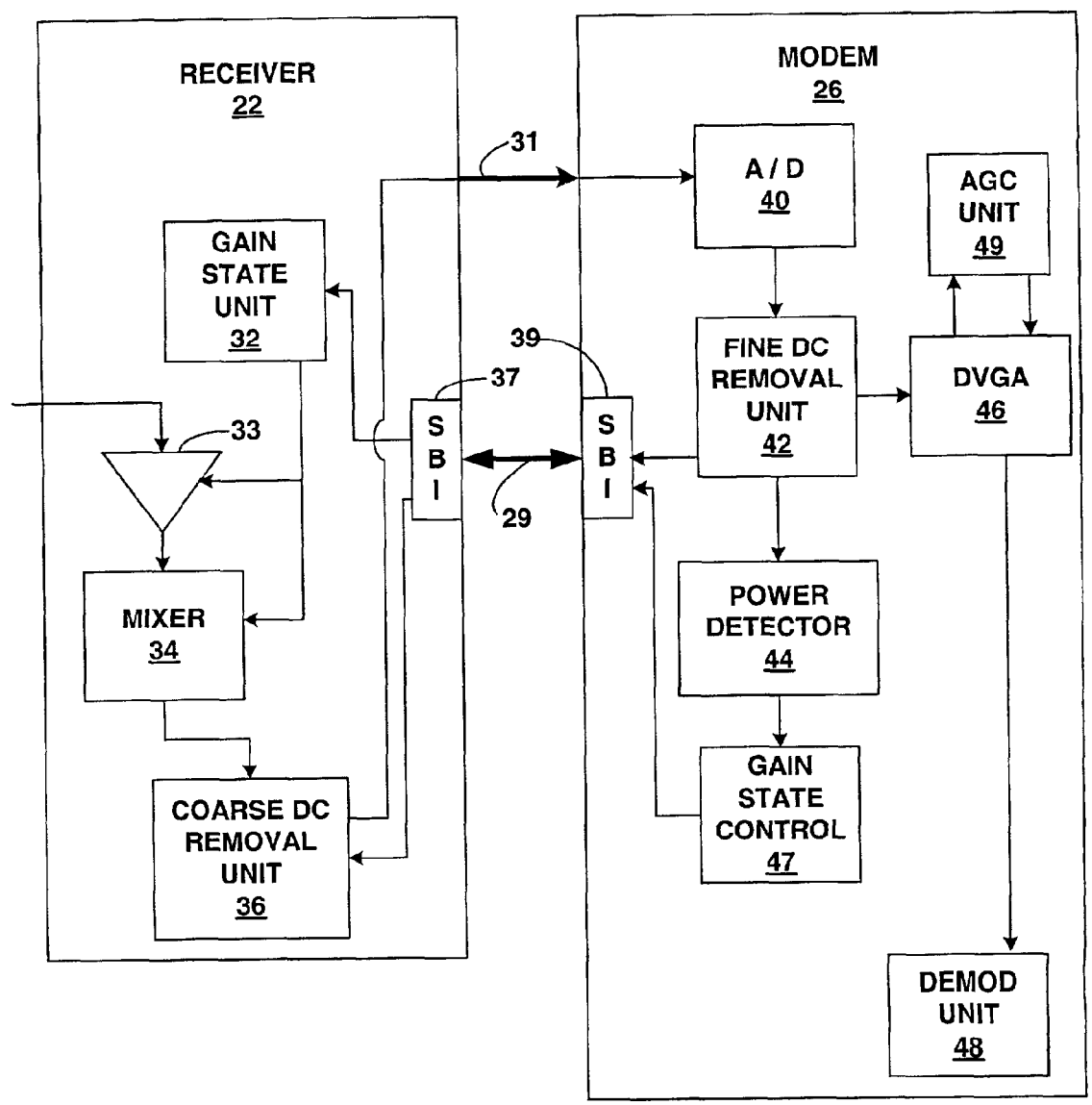
FIG. 3 is a block diagram of a receiver and modem of the WCD depicted in FIG. 2.

FIG. 3 is a block diagram illustrating in greater detail one implementation of receiver 22 coupled to modem 26. As shown, receiver 22 may include a gain state unit 32 that stores the selected gain state for processing of a received packet. Gain state unit 32, for example, may begin with the highest gain state in order to ensure that the lowest power signals can be detected and processed. The implementation of discrete gain states can simplify and improve WCD 10 by avoiding the need for continuous analog closed-loop automatic gain control.

Amplifier 33 scales a received RF waveform according to the current gain state and provides the scaled signal to mixer 34. Mixer 34 receives the RF signal from amplifier 33 and mixes it down to I- and Q-baseband signals (sometimes referred to as the downconversion process). For example, mixer 34 may implement a frequency synthesizer that utilizes a local oscillator (LO) of WCD 10 as a timing reference. Thus, mixer 34 may remove the RF carrier component of the received RF signal to generate the baseband signals associated with the received packet. As desired, receiver 22 may also include additional components such as various filters, and the like.

Coarse DC removal unit 36 stores values indicative of an estimated DC offset associated with the received baseband signal. In this manner, coarse DC removal unit 36 can quickly remove DC from the baseband signal associated with the received packet within the time constraints imposed by certain WLAN standards. In particular, coarse DC removal unit 36 may store DC offset values associated with each of the gain states. In that case, coarse DC removal unit 36 may select the appropriate DC offset value according to the gain state identified by gain state unit 32 in order to remove the appropriate amount of DC from the baseband signal.

After coarse DC removal unit 36 has removed a DC offset in the baseband signals, the baseband signals can be sent to modem 26 for demodulation. For example, the baseband signals can be sent from receiver 22 to modem 26 via analog transmission line 31. Receiver 22 and modem 26 may also be coupled together by a serial bus 29. Accordingly, receiver 22 and modem 26 may each include a serial bus interface 37, 39 to facilitate data transmission over serial bus 29.

Upon receiving the I- and Q-baseband signals, modem 26 converts the signals to a digital representation (referred to as a digital baseband signal). In particular, analog-to-digital (A/D) converter 40 samples a received analog baseband signal and produces the corresponding digital baseband signal in the form of 10-bit samples. Larger or smaller A/D converters could also be used to generate the digital baseband signal in the form or larger of smaller samples. Fine DC removal unit 42 implements a DC removal loop to remove residual DC from the digital baseband signal. In addition, fine DC removal unit 42 may include a coarse DC estimator to estimate the residual DC offset associated with the baseband signal at the current gain state, and update coarse DC removal unit 36 via serial bus 29 so that subsequently received packets processed at that gain state have more appropriate DC removed by coarse DC removal unit 36. After removing the residual DC from the digital baseband signal, fine DC removal unit 42 forwards the digital baseband signals to power detector 44 and a digital voltage gain amplifier (DVGA) 46. In some cases, DVGA 46 and demodulation unit 48 are activated after power has been detected by power detector 44.

Power detector 44 may perform power detection in order to assess whether the gain state should be reduced. Power detector 44 may implement a plurality of power detection modules so that gain state reductions, if necessary, can be made within an RF training period. For example, if one or more components of modem 26 are overloaded or saturated, gain control unit 47 sends a signal to gain state unit 32 via serial bus 29 to cause gain state unit 32 to reduce the gain state.

DVGA 46 also receives the baseband samples from fine DC removal unit 42. DVGA 46 performs residual gain adjustments to more precisely scale the digital baseband samples. For example, DVGA 46 can be used to scale the digital baseband signal, either by amplifying or attenuating the digital samples. AGC unit 49 controls the gain of DVGA 46 as outlined in greater detail below. By incorporating the techniques and architecture outlined below, DVGA 46 and AGC unit 49 can be improved, particularly when used in processing baseband signals modulated according to a wireless networking standard such as an IEEE 802.11 standard. After scaling the digital baseband signal, DVGA 46 then forwards the scaled digital baseband samples to demodulation unit 48 for demodulation and data extraction.

Figure 4:
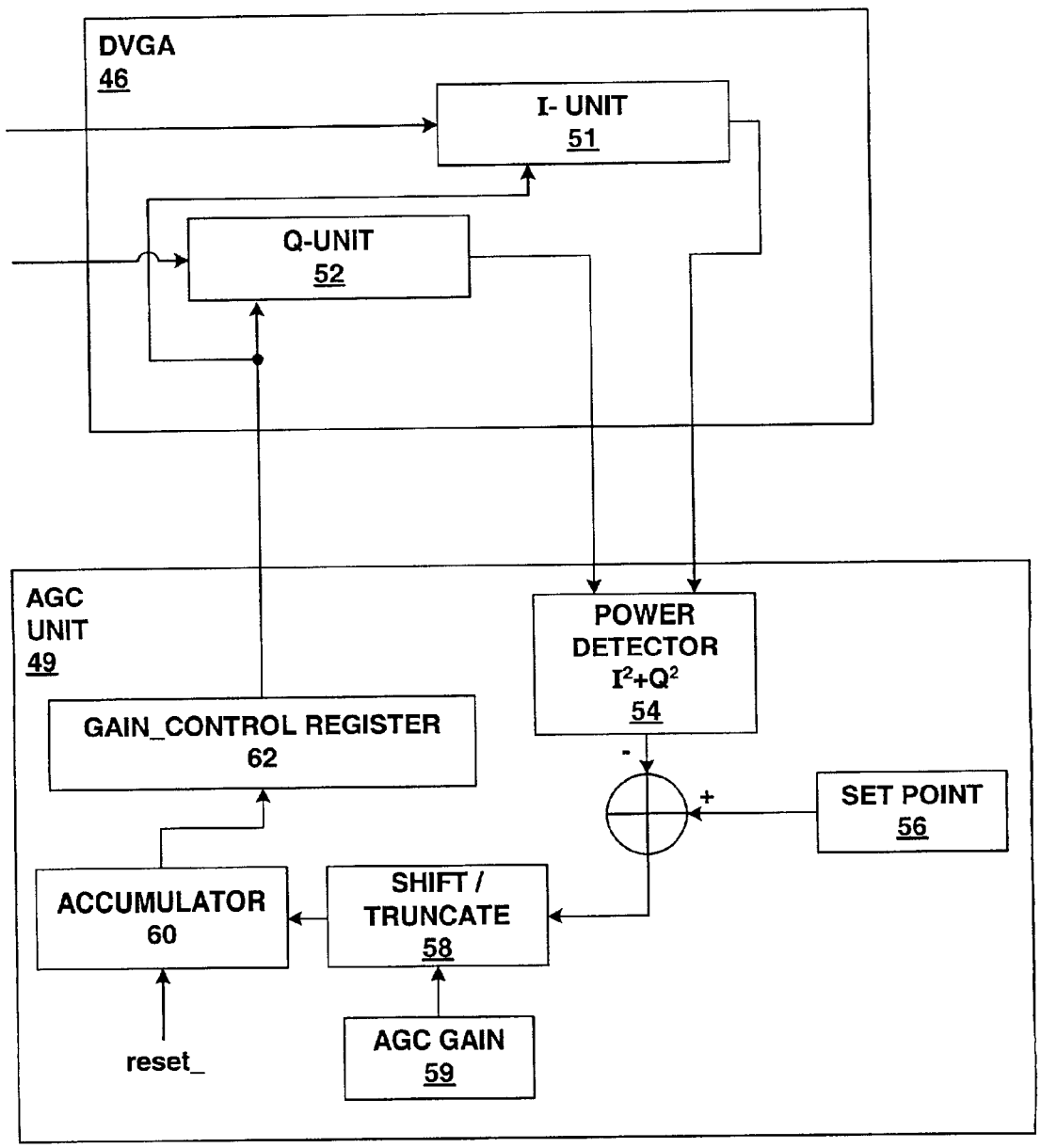
FIG. 4 is a block diagram of the digital variable gain amplifier (DVGA) depicted in FIG. 3, being controlled by an automatic gain control (AGC) unit.

FIG. 4 is a more detailed block diagram of DVGA 46 and AGC unit 49. DVGA 46 receives 10-bit baseband samples from fine DC removal unit 42. In particular, DVGA 46 receives both I- and Q-baseband samples. DVGA 46 may include an I-unit 51 to perform residual gain adjustments to the 10-bit I-baseband samples, and a Q-unit 52 to perform residual gain adjustments to the 10-bit Q-baseband samples. Many of the details of DVGA 46 are outlined below with specific reference to I-unit 51. It is understood that the similar logic is duplicated in Q-unit 52.

Both I-unit 51 and Q-unit 52 generate output signals by multiplying an input sample by a gain factor and adding the resulting product to a quantity obtained by left-shifting the bits of the input sample. The output sample is extracted from the resulting sum.

The output samples from the I-unit 51 and Q-unit 52 are provided to power detector 54 of AGC unit 49. The power contained in the output samples is computed by power detector 54 according to a power detection algorithm, such as an algorithm that calculates $I^2+Q^2$. The detected power can be compared to a set point 56 such as by subtracting the calculated power level from the set point 56. Set point 56 may be stored in local memory of AGC unit 49, and may correspond to a programmable value that can be selected to maximize the signal to noise ratio and minimize saturation effects. For example, if the set point is set to 200, $I^2+Q^2=200$, where I and Q each have average RMS values corresponding to 10 least significant bits.

The differences may be truncated or shifted by unit 58, depending on the speed at which AGC unit 49 is chosen to operate. AGC gain 59 represents a programmable input to shift/truncate unit 58 that defines how fast AGC unit 49 causes convergence to the set point. In other words, AGC gain 59 can be used to adjust the responsiveness of AGC unit 49 to individual baseband samples. Accumulator 60 accumulates the differences to define a AGC control word stored in gain_control register 62. When new packets are received, a reset_signal may be provided to accumulator 60 to reset its value, e.g. to a maximum value. Initializing accumulator 60 to an initially large value may cause faster convergence to the set point, on average. In that case, increases to the accumulation may be limited to the value of the set point for each power estimate, but decreases to the accumulation could be much larger, e.g., if calculated power was significantly larger than the set point.

The control word stored in gain control register 62 can be used to define the gain of DVGA 46 and to perform bit selection of the baseband samples. For example, the four most significant bits of the control word may be used to define which bits are selected by the I-unit 51 and Q-unit 52, and the next four most significant bits of the control word can be multiplied to the respective baseband samples prior to the bit selection process as outlined in greater detail below. In this manner, AGC unit 49 is used to adjust the gain of DVGA 46 during processing of a received packet modulated according to a wireless networking standard.

Figure 5:
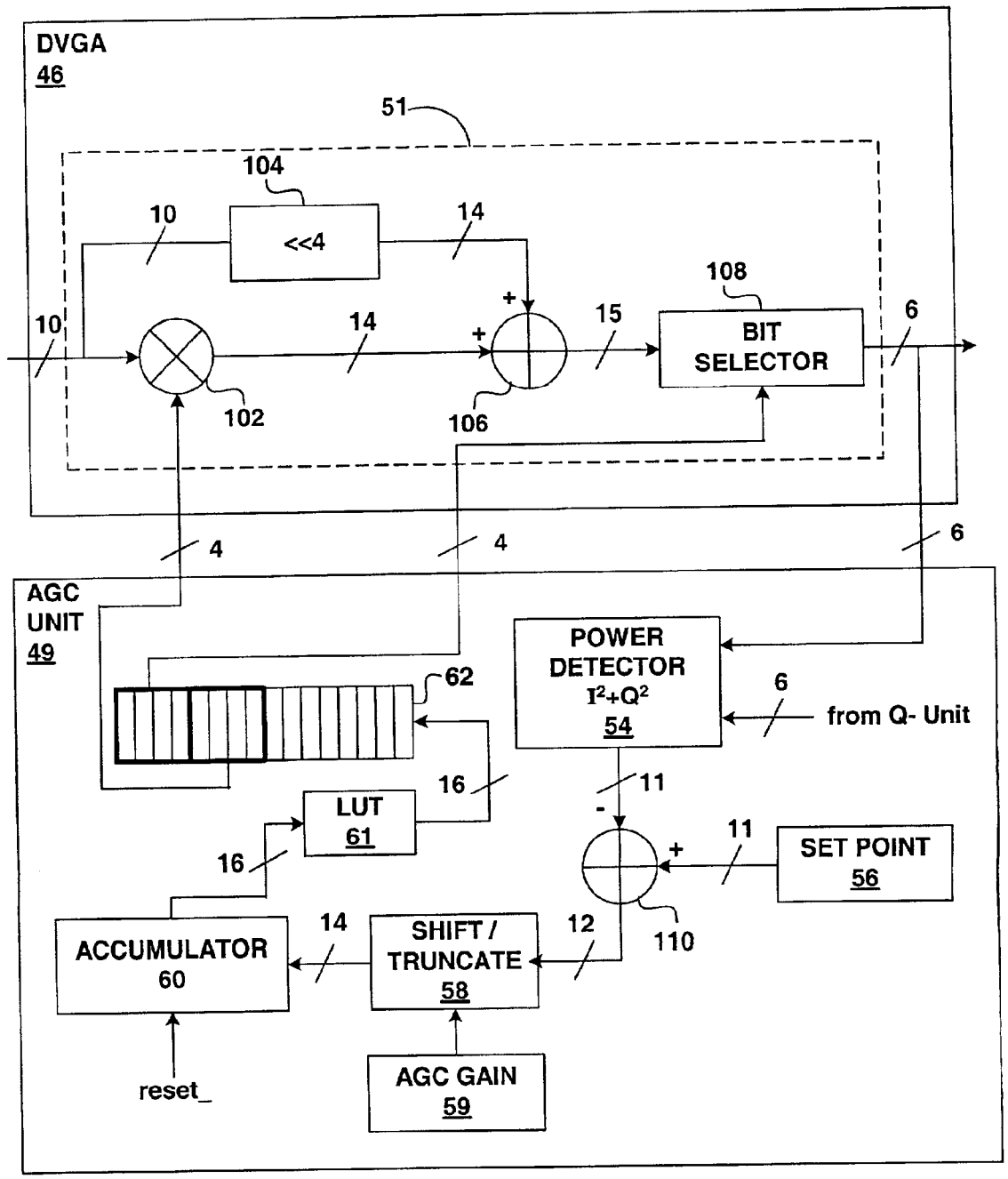
FIG. 5 is a more detailed block diagram of the DVGA coupled to the AGC unit.

FIG. 5 is a more detailed block diagram of DVGA 46 and AGC unit 49 according to one embodiment. In FIG. 5, the logic of DVGA 46 is illustrated with reference to I-unit 51. It is understood, however, that similar logic is duplicated in DVGA 46 in Q-unit 52 (FIG. 4), which handles the quadrature-phase baseband samples. As shown in FIG. 5, DVGA 46 receives 10-bit baseband samples. Multiplier 102 multiplies the 10-bit samples by a 4-bit gain factor defined by AGC unit 49 as outlined below in order to generate a 14-bit product. Also, shift register 104 of DVGA 46 shifts the 10-bit sample to generate a shifted value having 14-bits. The 14-bit product and 14-bit shifted value are then summed by adder 106 in order to generate a 15-bit sum. Bit selector 108 receives the 15-bit sum and selects the appropriate 6-bits from the 15-bit sum. The selected bits may be defined by the AGC unit 49. For example, the four most significant bits of a control word stored and updated by AGC unit 49 can be mapped to the selected bits of the 15-bit sum, such as via a lookup table (LUT) stored by bit selector 108.

The actual bit-size of the baseband samples, the product, the shifted value, and the sum may vary in different implementations. In general, DVGA 46 includes a multiplier 102 to multiply an M-bit baseband sample by an N-bit gain factor to generate a product having M+N bits, a shift register 104 to shift the M-bit baseband sample by N bits to generate a shifted value having M+N bits, and a bit selector 108 to generate an output by selecting at least a subset of M+N+1 bits of a sum of the product and the shifted value. The sum of the product and shifted value can be produced by adder 106.

In other words, all of the bits of the product of the input baseband sample and the gain factor are used by bit selector 108. Because all of the bits of the product may be used in extracting the output signal, AGC performance may be improved. In particular, the input amplitude for a small signal may converge to a desired level more smoothly compared to DVGAs in which the bits of the product of the input signal and the gain factor are rounded or truncated. For example, a DVGA could round the 14-bit product to 10-bits and sum the 10-bit rounded value with the 10-bit input sample, but such a summation would be a less optimal value for use by bit selector 108. By avoiding truncation of the M+N bit product to match the bit size of the baseband sample, and instead shifting the baseband sample by N bits to match the M+N bit size of the product, performance of DVGA 46 can be enhanced.

Bit selector 108 may output the selected 6-bits to demodulation unit 48 (FIG. 3) for demodulation. In addition, the 6-bit value can be provided to AGC unit 49 so that automatic gain adjustments can be made. Again, DVGA 46 includes duplicative logic for handing both the I- and Q-baseband samples. Thus, AGC unit 49 receives selected 6-bit samples from both an I-unit 51 and a Q-unit 52 (FIG. 4).

Power detector 54 receives the selected 6-bit samples from I-unit 51 and Q-unit 52, and sums the magnitudes of the 6-bit samples, i.e., performs $I^2+Q^2$ to generate an 11-bit value indicative of the power level of the baseband samples. The 11-bit power level is compared to a set point 56, which represents a target power level for the baseband samples. For example, set point 56 may be programmed in order to maximize signal to noise ratio and minimize saturation effects. In one example, the set point can be set to 200. In that case, $I^2+Q^2=200$ where I and Q each have average RMS values corresponding to 10 least significant bits.

Subtractor 110 can be used to compare the power level to the set point, such as by subtracting the power level from the set point to generate a difference. The difference represents an error signal indicative of the power error present in the baseband samples. The difference may be truncated or shifted by unit 58, depending on the speed at which AGC unit 49 is chosen to operate. AGC gain 59 represents a programmable input to shift/truncate unit 58 that defines how fast AGC unit 49 causes convergence to the set point and the responsiveness of AGC unit 49 to each individual baseband sample. In the illustrated example, unit 58 shifts the 12-bit differences by 2-bits to generate 14-bit difference values. The 14-bit difference values are accumulated by accumulator 60. In particular, translation of the difference values (in units of power) to linear values can be avoided. Accumulator 60 may store a 16-bit accumulation. The accumulation itself may be translated by LUT 61 in order to generate a control word stored in gain_control register 62. For example, LUT 61 may re-bias the accumulation, and possibly map values to their square roots to convert the accumulation from units of power to a linear value.

The 16-bit control word stored in gain_control register 62 may be used by DVGA 46 as follows. The most significant bits can be used by bit selector 108 to select the appropriate 6-bit sample from the 15-bit sum of the product and shifted values. For example, bit selector 108 may store a lookup table (LUT) that maps bit selection to the most significant bits of the control word.

In addition, the 16-bit control word stored in gain_control register 62 may be used by DVGA to define the 4-bit gain factor which multiplier 102 uses to multiply the received 10-bit baseband sample in order to generate the 14-bit product. In one example, gain_control register 62 stores a 16-bit control word $b_{15}b_{14}b_{13}b_{12} \ldots b_0$. Multiplier 102 multiplies the 10-bit baseband sample with a 4-bit gain factor corresponding to portion $b_{11}b_{10}b_9b_8$ of the word stored in register 62, thereby generating a 14-bit product.

Shift register 104 shifts the 10-bit baseband sample received from fine DC removal unit 42 (FIG. 3) to the left by four bits so as to generate a 14-bit quantity. Adder 106 generates the 15-bit sum $a_{14}a_{13}a_{12}a_{11} \ldots a_0$ of this 14-bit quantity and the 14-bit product. To generate the output signal, a bit selector 108 selects six bits from the 15-bit sum $a_{14}a_{13}a_{12}a_{11} \ldots a_0$. The process of multiplying the baseband sample by the gain factor to generate a product, shifting the baseband sample, and selecting the output from the sum may be referred to herein as "applying the gain factor." The particular six bits extracted to form the output are selected according to a 4-bit portion $b_{15}b_{14}b_{13}b_{12}$, i.e., the most significant four bits, of the control word stored in register 62. In one embodiment, the particular six bits to be extracted may be selected according to the following TABLE 1 which can be stored by bit selector 108 as a LUT. The output is denoted as $c_5c_4c_3c_2c_1c_0$.

TABLE 1

| $b_{15}b_{14}b_{13}b_{12}$ | $c_5$ | $c_4$ | $c_3$ | $c_2$ | $c_1$ | $c_0$ |
|---|---|---|---|---|---|---|
| 0000 | $a_{14}$ | 0 | 0 | 0 | $a_{13}$ | $a_{12}$ |
| 0001 | $a_{14}$ | 0 | 0 | $a_{13}$ | $a_{12}$ | $a_{11}$ |
| 0010 | $a_{14}$ | 0 | $a_{13}$ | $a_{12}$ | $a_{11}$ | $a_{10}$ |
| 0011 | $a_{14}$ | $a_{13}$ | $a_{12}$ | $a_{11}$ | $a_{10}$ | $a_9$ |
| 0100 | $a_{14}$ | $a_{12}$ | $a_{11}$ | $a_{10}$ | $a_9$ | $a_8$ |
| 0101 | $a_{14}$ | $a_{11}$ | $a_{10}$ | $a_9$ | $a_8$ | $a_7$ |
| 0110 | $a_{14}$ | $a_{10}$ | $a_9$ | $a_8$ | $a_7$ | $a_6$ |
| 0111 | $a_{14}$ | $a_9$ | $a_8$ | $a_7$ | $a_6$ | $a_5$ |
| 1000 | $a_{14}$ | $a_8$ | $a_7$ | $a_6$ | $a_5$ | $a_4$ |
| 1001 | $a_{14}$ | $a_7$ | $a_6$ | $a_5$ | $a_4$ | $a_3$ |
| 1010 | $a_{14}$ | $a_6$ | $a_5$ | $a_4$ | $a_3$ | $a_2$ |
| 1011 | $a_{14}$ | $a_5$ | $a_4$ | $a_3$ | $a_2$ | $a_1$ |
| 1100 | $a_{14}$ | $a_4$ | $a_3$ | $a_2$ | $a_1$ | $a_0$ |
| 1101 | $a_{14}$ | $a_3$ | $a_2$ | $a_1$ | $a_0$ | 0 |
| 1110 | $a_{14}$ | $a_2$ | $a_1$ | $a_0$ | 0 | 0 |
| 1111 | $a_{14}$ | $a_1$ | $a_0$ | 0 | 0 | 0 |

The bit $c_5$, corresponding to the bit $a_{14}$ of the 15-bit sum generated by adder 106, is treated as a sign bit. Thus, the output $c_5c_4c_3c_2c_1c_0$ may represent a quantity between −31 and +31, inclusive. As shown in the above table, higher values of $b_{15}b_{14}b_{13}b_{12}$ result in the output being formed from less significant bits of the sum $a_{14}a_{13}a_{12}a_{11} \ldots a_0$. These values of $b_{15}b_{14}b_{13}b_{12}$ represent higher gain and would thus be used with small signals. Advantageously, the full range of bits $a_{14}a_{13}a_{12}a_{11} \ldots a_0$ is available for forming the output $c_5c_4c_3c_2c_1c_0$. As a result, the output of DVGA 46 may converge to the desired set point more smoothly, particularly for small signals for which the output is formed using less significant bits of the sum $a_{14}a_{13}a_{12}a_{11} \ldots a_0$.

When new packets are received by WCD 10, a reset_ signal may be provided to accumulator 60 to reset its value, e.g. to a maximum value. Initializing accumulator 60 to an initially large value may cause faster convergence to the set point, on average. In that case, increases to the accumulation may be limited to the value of the set point for each power estimate, but decreases to the accumulation could be much larger, e.g., if calculated power was significantly larger than the set point. Thus, by setting the accumulation to a maximum value, convergence to the correct value, on average, may take less time than it would if the accumulation was initialized to some other value, such as zero.

Figure 6:
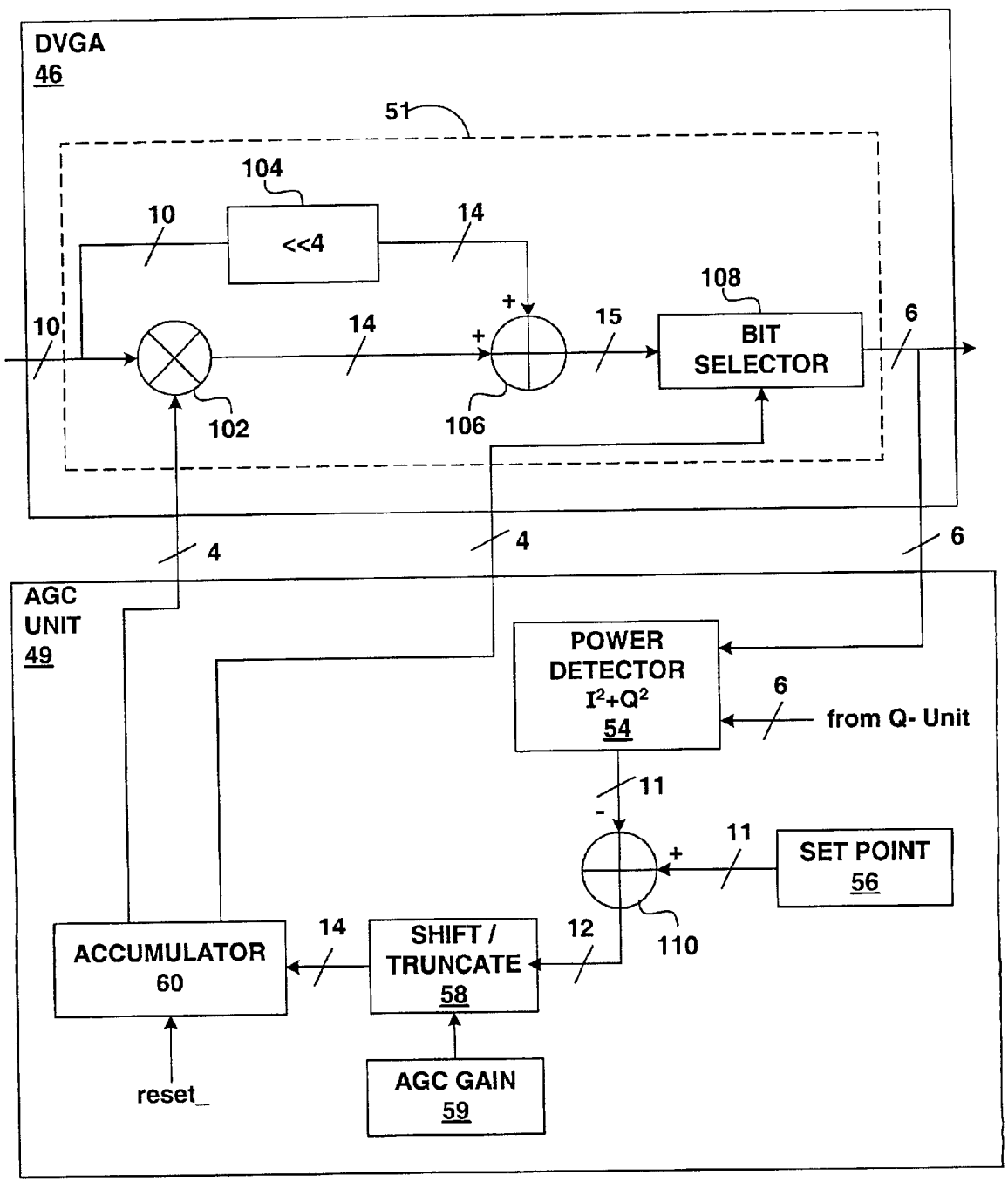
FIG. 6 is another exemplary block diagram of a DVGA coupled to an AGC unit.

FIG. 6 is another detailed block diagram of DVGA 46 and AGC unit 49 according to an embodiment. The configuration of FIG. 6 represents a slight variation of the configuration of FIG. 5. In particular, the separate gain_control register 62 is removed, and the accumulation in accumulator 60 is used directly to control the gain and bit selection of DVGA 46. In this manner, the need for LUT 61 can be avoided, further simplifying the architecture. The accumulation is in units of power, but DVGA 46 performs functions on the baseband samples in units of voltage. For this reason, translation of the accumulation to a linear representation using LUT 61 seems necessary. However, simulations have shown that translation of the difference values prior to accumulation, and/or translation of the accumulation itself, is not necessary to yield acceptable results. Accordingly, the configuration illustrated in FIG. 6 may yield acceptable results with a more simplified architecture. In that case, the LUT stored in bit selector 108 would be similar to TABLE 1 above. However, the LUT stored in bit selector 108 would map bits of the accumulation to bits of the 15-bit sum. In other words, the accumulation itself would function as the control word, and translations of the accumulation to a linear value can be avoided.

Figure 7:
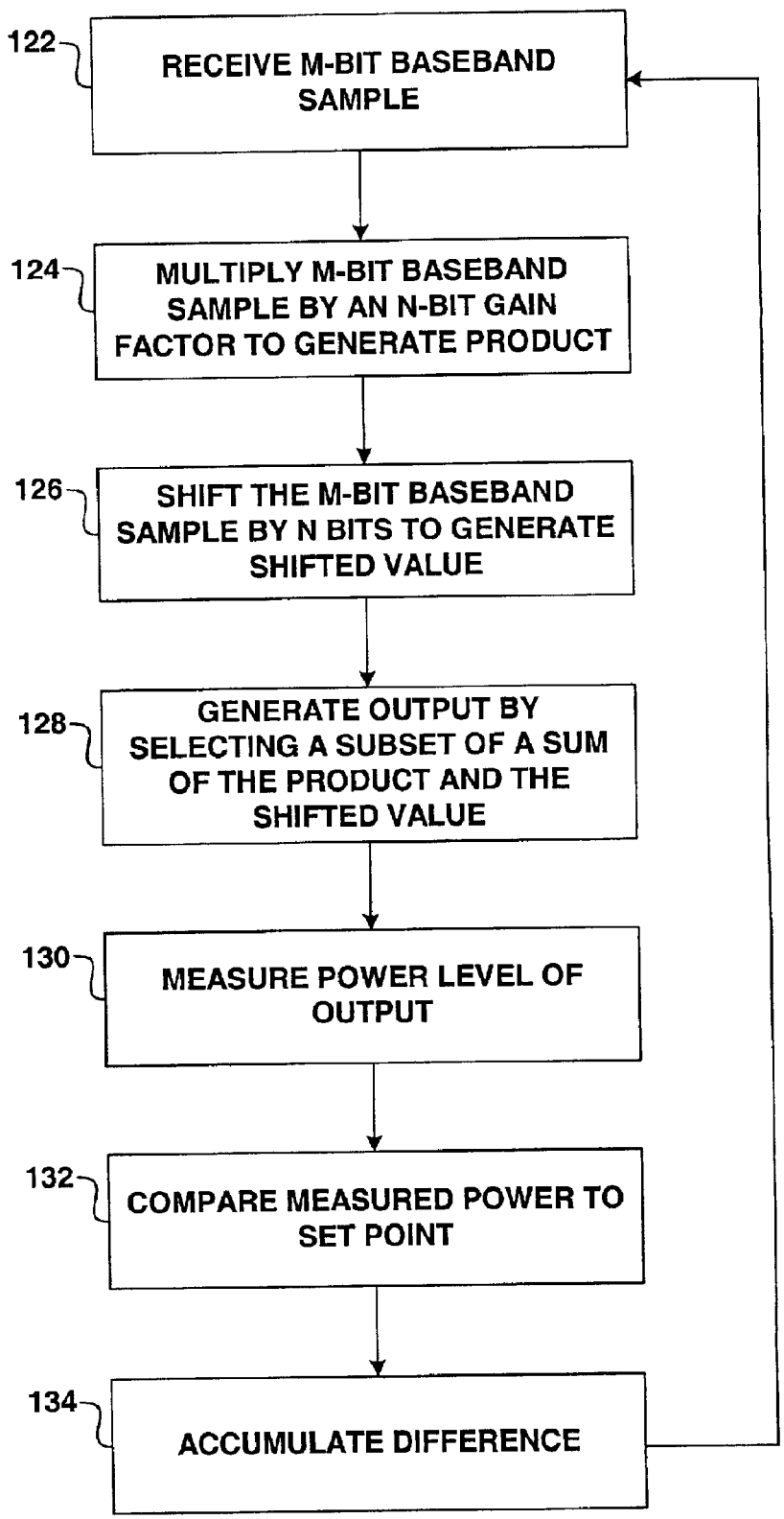
FIG. 7 is a flow diagram illustrating signal processing techniques that can be implemented in a WCD.

FIG. 7 is a flow diagram illustrating a signal processing technique that may be performed by a wireless communication device. As illustrated, DVGA 46 receives an M-bit baseband sample from DC removal unit 42 (122). DVGA 46 multiplies the M-bit baseband sample by an N-bit gain factor to generate an M+N bit product (124). In addition, DVGA 46 shifts the M-bit baseband sample by N bits to generate a shifted value (126). DVGA 46 then generates output by selecting a subset of a sum of the product and shifted value (128). The output can be forwarded to demodulation unit 48 for demodulation, and to AGC unit 49 so that automatic gain control can be performed to more properly scale subsequent baseband samples.

AGC unit 49 measures the power level of the output, such as by calculating $I^2+Q^2$ from input of a 6-bit I-baseband sample and a 6-bit Q-baseband sample (130). AGC unit 49 compares the power level to a set point to generate a difference that corresponds to a power error in the baseband samples (132). AGC unit 49 accumulates the difference so that it can be used for controlling the gain factor and bit selection of subsequent baseband samples (134). In some cases, the accumulation is translated into a control word, and in other cases, the accumulation itself is the control word. This process may continue to process a number of baseband samples that correspond to a received packet. When a new packet is received, the accumulator 60 in AGC unit 49 can be reset, such as to a maximum value, and the process of FIG. 7 can be repeated. In this manner, digital automatic gain control can be improved for handing packets received according to a wireless networking standard such as an IEEE 802.11 standard.

Various techniques for processing wireless signals have been described as being implemented in hardware. Example hardware implementations may include implementations within a DSP, an application specific integrated circuit (ASIC), a field programmable gate array (FPGA), a programmable logic device, specifically designed hardware components, or any combination thereof. In addition, one or more of the techniques described herein may be partially or wholly executed in software. In that case, a computer readable medium may store computer readable instructions that can be executed by a processor to carry out one of more of the techniques described above. For example, the medium may be an computer-readable medium suitable for storing instructions, including random access memory (RAM), read-only memory (ROM), non-volatile random access memory (NVRAM), electrically erasable programmable read-only memory (EEPROM), flash memory, and the like.

In addition, other modifications may also be made without departing from the spirit and scope of the invention. For example, the DVGA and AGC architecture described above may also be implemented to process signals modulated according to CDMA techniques, TDMA techniques, FDMA techniques, combinations of techniques, or the like. Accordingly, these and other embodiments are within the scope of the following claims.

What is claimed is:

1. A method comprising:
    multiplying an M-bit baseband sample of an RF signal by an N-bit gain factor to generate a product having M+N bits;
    shifting the M-bit baseband sample by N bits to generate a shifted value having M+N bits; and
    generating an output by selecting a subset of M+N+1 bits of a sum of the product and the shifted value.

2. The method of claim 1, further comprising:
    measuring a power level of the output; and
    adjusting the N-bit gain factor as a function of the power level.

3. The method of claim 2, further comprising:
    storing a control word having a plurality of bits, wherein the control word has a value indicative of the measured power level;
    determining the gain factor as a function of the control word; and
    generating the output by selecting the subset of M+N+1 bits as a function of the control word.

4. The method of claim 3, further comprising determining the N-bit gain factor as a function of at least a subset of a plurality of bits of the control word.

5. The method of claim 3, further comprising generating the output by selecting the subset of M+N+1 bits as a function of a subset of a plurality of bits of the control word.

6. The method of claim 1, wherein the RF signal is modulated according to a wireless networking standard.

7. A wireless communication device comprising:
    a variable gain amplifier including:
        a multiplier to multiply an M-bit baseband sample of an RF signal by an N-bit gain factor to generate a product having M+N bits,
        a shift register to shift the M-bit baseband sample by N bits to generate a shifted value having M+N bits, and
        a bit selector to generate an output by selecting at least a subset of M+N+1 bits of a sum of the product and the shifted value; and
    a demodulation unit to demodulate the output.

8. The wireless communication device of claim 7, further comprising:
    a power detector to measure a power level of the output; and
    an accumulator to accumulate differences between the measured power level and a set point, wherein the gain factor is defined by the accumulation.

9. The wireless communication device of claim 7, further comprising a register to store a control word having a plurality of bits, wherein the accumulation defines the control word, and wherein the gain factor is determined as a function of at least a subset of the plurality of bits of the control word.

10. The wireless communication device of claim 9, wherein the bit selector is configured to generate the output by selecting the subset of M+N+1 bits as a function of at least a subset of the plurality of bits of the control word.

11. The wireless communication device of claim 7, wherein RF signal is modulated according to a wireless networking standard.

12. A variable gain amplifier comprising:
   a multiplier to multiply an M-bit baseband sample of an RF signal by an N-bit gain factor to generate a product having M+N bits;
   a shift register to shift the M-bit baseband sample by N bits to generate a shifted value having M+N bits; and
   a bit selector to generate an output by selecting at least a subset of M+N+1 bits of a sum of the product and the shifted value.

13. An integrated circuit comprising:
   a variable gain amplifier including:
      a multiplier to multiply an M-bit baseband sample of an RF signal by an N-bit gain factor to generate a product having M+N bits,
      a shift register to shift the M-bit baseband sample by N bits to generate a shifted value having M+N bits, and
      a bit selector to generate an output by selecting at least a subset of M+N+1 bits of a sum of the product and the shifted value; and
   an automatic gain control unit that defines the gain factor.

14. The integrated circuit of claim 13, wherein the automatic gain control unit includes:
   a power detector to measure a power level of the output; and
   an accumulator to accumulate a difference between the measured power level and a set point, wherein the gain factor is adjusted according to the accumulation.

15. The integrated circuit of claim 14, wherein the automatic gain control unit includes a register to store a control word having a plurality of bits, the control word being defined as a function of the accumulation.

16. The integrated circuit of claim 15, wherein the gain factor is determined as a function of at least a subset of the plurality of bits of the control word.

17. The integrated circuit of claim 15, wherein the bit selector is configured to generate the output by selecting the subset of M+N+1 bits as a function of at least a subset of the plurality of bits of the control word.

18. An apparatus comprising:
   means for multiplying an M-bit baseband sample of an RF signal by an N-bit gain factor to generate a product having M+N bits;
   means for shifting the M-bit baseband sample by N bits to generate a shifted value having M+N bits; and
   means for generating an output by selecting at least a subset of M+N+1 bits of a sum of the product and the shifted value.

19. The apparatus of claim 18, further comprising:
   means for measuring a power level of the output; and
   means for adjusting the gain factor as a function of the power level.

20. The apparatus of claim 18, further comprising:
   means for storing a control word having a plurality of bits;
   means for determining the gain factor as a function of the control word; and
   means for generating the output as a function of the control word.

21. The apparatus of claim 20, wherein the gain factor is determined as a function of at least a subset of the plurality of bits of the control word.

22. The apparatus of claim 20, further comprising means for generating the output by selecting the subset as a function of at least a subset of the plurality of bits of the control word.

* * * * *